US008043657B2

(12) United States Patent
Yoshihara et al.

(10) Patent No.: US 8,043,657 B2
(45) Date of Patent: Oct. 25, 2011

(54) COATING TREATMENT METHOD

(75) Inventors: Kousuke Yoshihara, Koshi (JP);
Tomohiro Iseki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1055 days.

(21) Appl. No.: 11/851,747

(22) Filed: Sep. 7, 2007

(65) Prior Publication Data

US 2008/0069948 A1    Mar. 20, 2008

(30) Foreign Application Priority Data

Sep. 14, 2006   (JP) .................................. 2006-249733

(51) Int. Cl.
*B05D 3/12* (2006.01)
(52) U.S. Cl. .......... 427/240; 427/425; 118/52; 118/320; 438/758
(58) Field of Classification Search .................. 427/240, 427/425; 118/52, 320; 438/758
See application file for complete search history.

(56) References Cited

U.S. PATENT DOCUMENTS

| | | | | |
|---|---|---|---|---|
| 5,405,813 A | * | 4/1995 | Rodrigues | 438/782 |
| 5,773,083 A | * | 6/1998 | Fischer et al. | 427/240 |
| 5,912,049 A | * | 6/1999 | Shirley | 427/240 |
| 2001/0033895 A1* | | 10/2001 | Minami et al. | 427/240 |
| 2005/0175771 A1* | | 8/2005 | Hisada | 427/162 |

FOREIGN PATENT DOCUMENTS

| | | |
|---|---|---|
| JP | 8-330206 | 12/1996 |
| JP | 11-260717 | 9/1999 |
| JP | 2001-307991 | 11/2001 |
| JP | 2003-145017 | 5/2003 |
| JP | 2003-249436 | 9/2003 |
| JP | 2004-273488 | 9/2004 |
| JP | 2006-80298 | 3/2006 |
| JP | 2006-156565 | 6/2006 |

OTHER PUBLICATIONS

Office Action issued Dec. 7, 2010, in Japan Patent Application No. 2006-249733 (with English-language Translation).
Japanese Office Action with English language translation issued in counterpart Japanese application No. 2006-249733 mailed on May 17, 2011.

* cited by examiner

*Primary Examiner* — Kirsten Jolley
(74) *Attorney, Agent, or Firm* — Oblon, Spivak, McClelland, Maier & Neustadt, L.L.P.

(57) ABSTRACT

The present invention supplies a solvent to the front surface of a substrate while rotating the substrate. Subsequently, the substrate is acceleratingly rotated to a first number of rotations, and a resist solution is supplied to a central portion of the substrate during the accelerating rotation and the rotation at the first number of rotations. Thereafter, the substrate is deceleratingly rotated to a second number of rotations, and after the number of rotations of the substrate reaches the second number of rotations, the resist solution is discharged to the substrate. The substrate is then acceleratingly rotated to a third number of rotations higher than the second number of rotations so that the substrate is rotated at the third number of rotations. According to the present invention, in application of the resist solution by spin coating, the consumption of the resist solution can be suppressed, and a high in-plane uniformity can be obtained for the film thickness of the resist film.

5 Claims, 12 Drawing Sheets

FIG.4
(i) PRE-WETTING
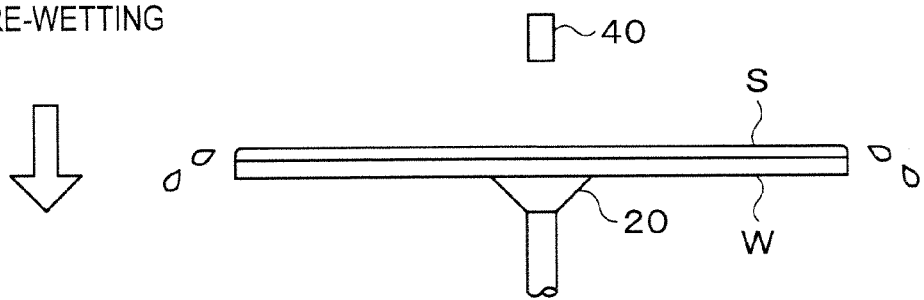
(ii) ACCELERATION, RESIST DISCHARGE
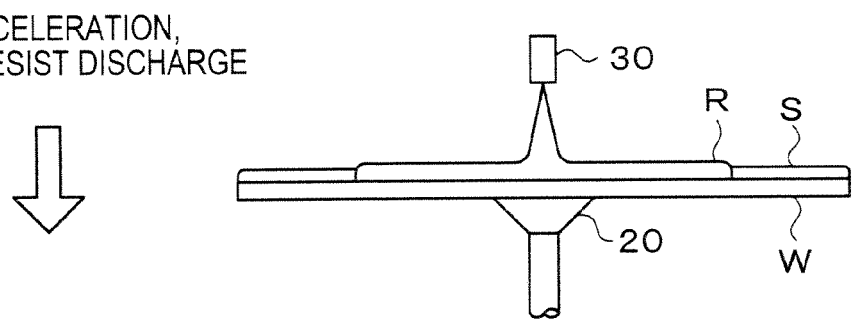
(iii) FIRST NUMBER OF ROTATIONS
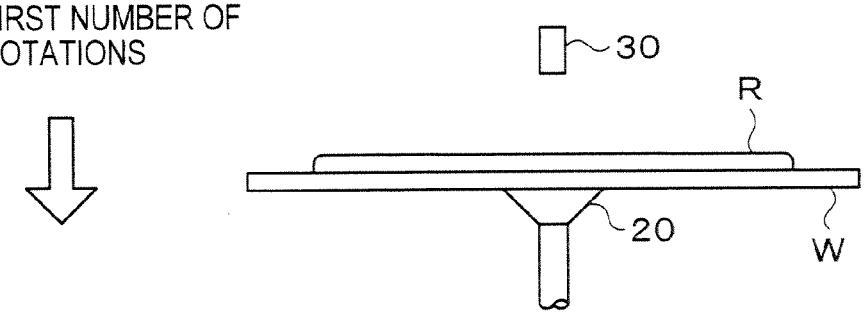
(iv) SECOND NUMBER OF ROTATIONS
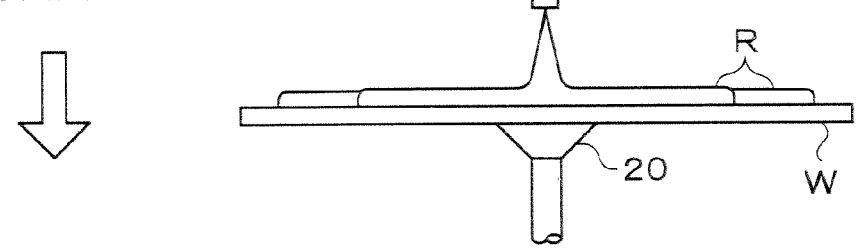
(v) THIRD NUMBER OF ROTATIONS
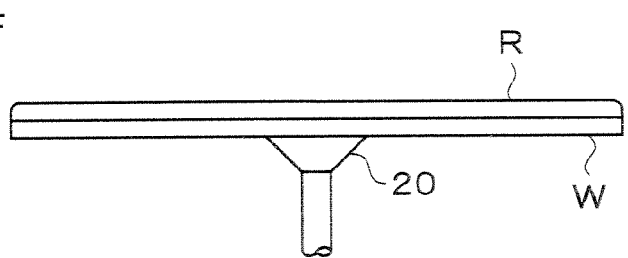

FIG.5
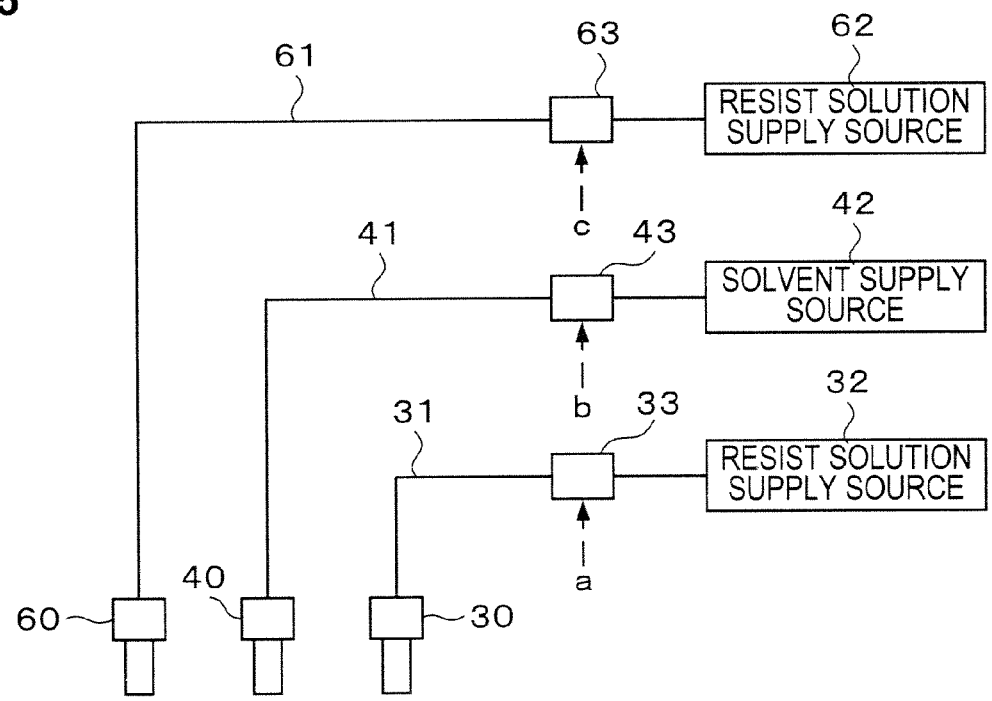
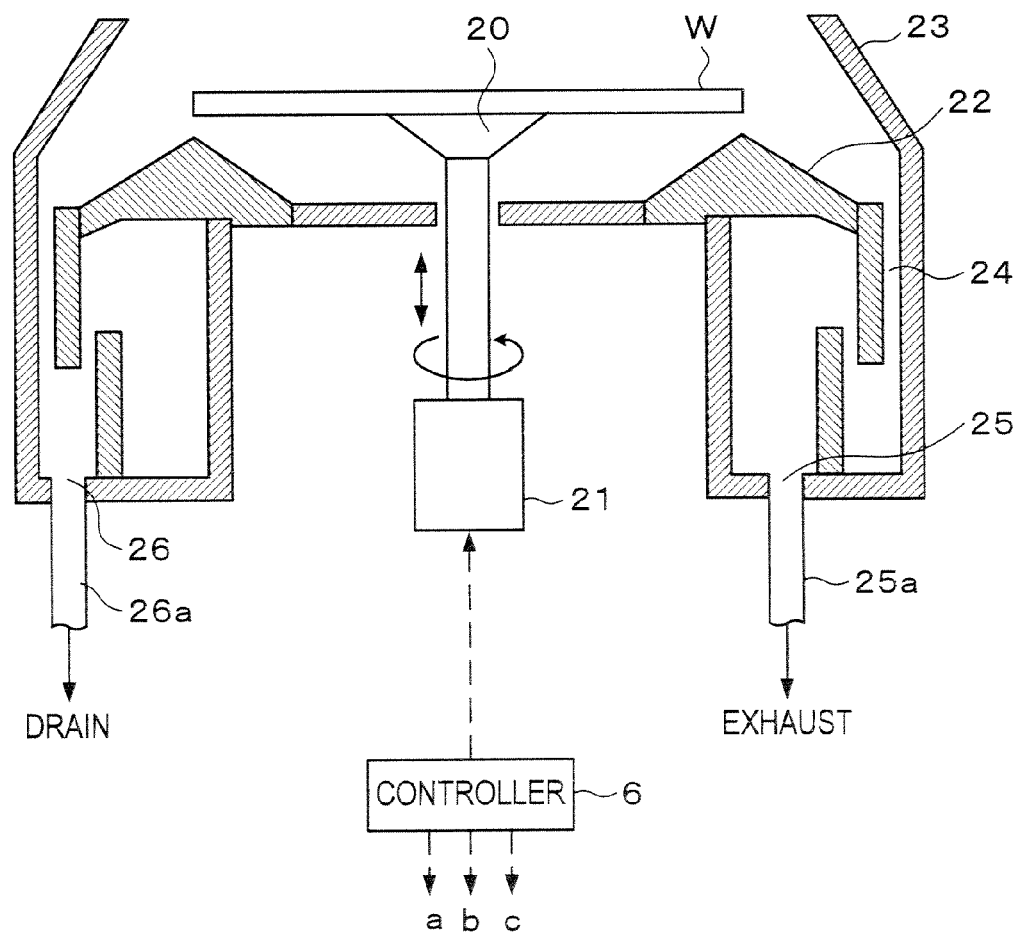

COATING TREATMENT METHOD

BACKGROUND OF THE INVENTION

1. Field of the Invention

The present invention relates to a coating treatment method for a substrate, such as a semiconductor wafer and the like.

2. Description of the Related Art

In the photolithography process in manufacture of a semiconductor device, a resist coating treatment of applying a resist solution, for example, onto a semiconductor wafer (hereinafter, referred to as a "wafer") to form a resist film is performed. As the coating treatment method, the spin coating method is generally employed. The spin coating method is a method of supplying a resist solution R from a nozzle 11 to the central portion of the front surface of the wafer W with the wafer W sucked to a spin chuck 10 as shown in FIG. 12, and rotating the spin chuck 10 at a high speed so as to spread the resist solution R outward in the radial direction of the wafer W by the centrifugal force.

To perform such a resist coating, it is necessary to apply the resist solution onto the wafer with high in-plane uniformity.

Incidentally, since miniaturization of the pattern of the semiconductor device and reduction in film thickness are required, various resist solutions adaptable to such photolithography are developed. However, the cost of the resist solutions is rising more than before because the resist solutions are required to have precise physical properties, so that the resist solutions are very expensive in the present circumstances. Therefore, the consumption of the resist solution needs to be further reduced, and accordingly a coating method is desired which can save the resist more than before and ensure a high in-plane uniformity for the film thickness.

Hence, according to a conventionally proposed resist coating method, the solvent for the resist solution is used to pre-wet the top of the wafer, and the resist solution is supplied to the wafer while the wafer is rotated at a first number of rotations, so that the resist solution is applied spreading outward in a direction of the radial of the wafer. Immediately after stop of the supply of the resist solution, the wafer is decelerated to a second number of rotations to adjust the film thickness, and then accelerate to a third number of rotations to shake off the remaining solution (Japanese Patent Application Laid-open No. H11-260717). In this case, specifically, the first number of rotations is 4500 rpm, the second number of rotations is 500 rpm, and the third number of rotations is 3000 rpm.

However, when the supply amount of the resist solution is small, the resist solution has sometimes not fully spread to the edge of the wafer while the wafer is rotated at the first number of rotations because of a weak centrifugal force exerted on the resist solution. In this case, the resist solution has been further spread while the wafer is rotated at the third number of rotations so that the resist solution is applied over the entire wafer. In the case where the resist solution is spread separately at two stages as described above, the resist solution dries to decrease in flowability during the rotation of the wafer at the second number of rotations and therefore is different in speed of spreading on the wafer between the case when the wafer is rotated at the first number of rotations and the case when the wafer is rotated at the third number of rotations. More specifically, in the case of the wafer with a diameter of 300 mm, the film thickness of the resist film may be different between the outside and the inside with a circle with a radius of 120 mm as a boundary (occurrence of a so-called polarization of the film thickness), resulting in reduced in-plane uniformity of the film thickness.

SUMMARY OF THE INVENTION

The present invention has been developed in consideration of the above points and its object is to suppress the consumption of a resist solution and provide high in-plane uniformity for the film thickness of the resist film in application of the resist solution by spin coating.

To attain the above object, according to the present invention, a method of supplying a solvent for a resist solution to a substrate to wet a front surface of the substrate with the solvent and then coating the substrate with the resist solution includes: a first step of acceleratingly rotating the substrate to a first number of rotations after supplying the solvent thereto, and supplying the resist solution to a central portion of the substrate during at least the accelerating rotation or the rotation at the first number of rotations (rotation speed); a second step of thereafter deceleratingly rotating the substrate to a second number of rotations, and supplying the resist solution to the substrate during at least the decelerating rotation or the rotation at the second number of rotations (rotation speed); and a third step of thereafter acceleratingly rotating the substrate to a third number of rotations (rotation speed) higher than the second number of rotations, and rotating the substrate at the third number of rotations.

According to the present invention, the substrate is deceleratingly rotated to a second number of rotations and rotated at the second number of rotations during the second step, whereby the dry of the resist solution on the substrate is suppressed. In addition, the supply of the resist solution to the substrate during the second step improves the flowability of the resist solution on the substrate. Accordingly, when the supply amount of the resist solution is small, the resist solution smoothly spreads out to the edge of the substrate during the third step even if the resist solution does not completely spread to the edge of the substrate. This eliminates polarization of the distribution of the resist film to be formed on the wafer W, unlike the prior art, thereby increasing the in-plane uniformity of the film thickness of the resist film. In other words, the coating treatment with high in-plane uniformity of the film thickness can be performed even with a small amount of resist solution.

The supply of the resist solution in the second step may be performed after the number of rotations of the substrate reaches the second number of rotations. In the second step, the resist solution dries faster during the time when the substrate is deceleratingly rotated from the first number of rotations to the second number of rotations than during the time when the substrate is rotated at the second number of rotations. The supply of the resist solution in the second step is performed after the number of rotations of the substrate reaches the second number of rotations, thus eliminating the resist solution from drying during the decelerating rotation. Thus, the flowability of the resist solution can increase to spread more smoothly to the edge of the substrate in the third step.

The resist solution supplied in the second step may be supplied from a nozzle different from a nozzle for supplying the resist solution used in the first step. For example, when the resist solution supplied in the second step is different from the resist solution supplied in the first step, the resist solution can be smoothly supplied over the substrate in the second step by newly providing a nozzle different from the nozzle for supplying the resist solution used in the first step.

The resist solution supplied in the second step may be supplied to a position displaced from the central portion of the substrate. Since the resist solution is supplied to a position closer to the edge of the substrate, thus allowing the resist solution to smoothly spread to the edge of the substrate in the third step.

The supply of the resist solution in the second step may be performed continuously from the supply of the resist solution in the first step. Specifically, the resist solution supplied in the first step may be continuously supplied also in the second step.

The resist solution supplied in the second step may be a resist solution lower in viscosity than the resist solution supplied in the first step. The resist solution is decreased in viscosity by changing the ratio of the solvent contained in the resist solution. Accordingly, the flowability of the resist solution increases in the third step.

The solvent for the resist solution may be supplied in place of the resist solution supplied in the second step. The solvent is much lower in viscosity than the resist solution supplied in the first step. Accordingly, the flowability of the resist solution further increases in the third step.

According to the present invention, the resist solution supplied to the substrate improves in flowability and smoothly spreads over the substrate, so that that even if the supply amount of the resist solution is small, the in-plane uniformity of the film thickness of the resist film formed on the substrate can be increased.

BRIEF DESCRIPTION OF THE DRAWINGS

FIG. 4 is an operation explanatory view schematically showing the states at respective timings of the recipe shown in FIG. 3;

FIG. 5 is a schematic cross-sectional view showing a resist coating apparatus according to another embodiment;

DETAILED DESCRIPTION OF THE PREFERRED EMBODIMENT

A resist coating apparatus according to an embodiment of the present invention will be described with reference to FIG. 1 and FIG. 2.

Figure 1:
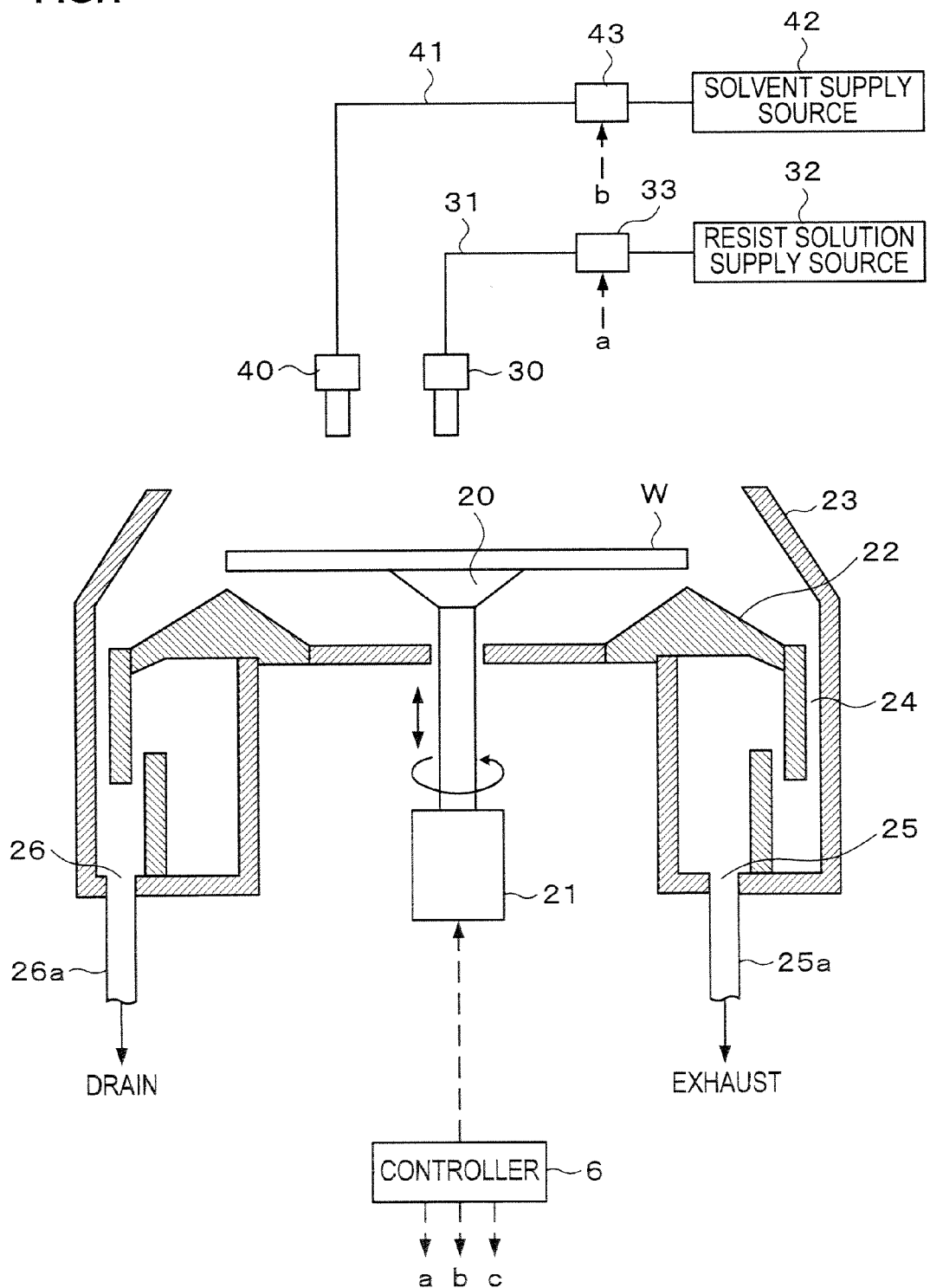
FIG. 1 is a schematic cross-sectional view showing a resist coating apparatus according to an embodiment.

Numeral 20 in FIG. 1 denotes a spin chuck, which forms a substrate holding unit, is configured to horizontally hold a wafer W by vacuum suction. The spin chuck 20 can rotate around the vertical by means of a rotation drive unit 21 including a motor and so on and can rise and lower. A guide ring 22 having a cross section in an angle shape is provided below the spin chuck 20, and the outer periphery of the guide ring 22 extends bending downward. A cup body 23 is provided in a manner to surround the spin chuck 20 and the guide ring 22.

The cup body 23 is formed at its upper surface with an opening larger than the wafer W so that the spin chuck 20 can rise and lower through it, and formed with a gap 24 forming a drainage path between its side peripheral surface and the outer periphery of the guide ring 22. The lower portion of the cup body 23 forms a bending path in conjunction with the outer peripheral portion of the guide ring 22 to constitute a gas/liquid separating section. An exhaust port 25 is formed at an inner side area of the bottom portion of the cup body 23, and an exhaust pipe 25a is connected to the exhaust port 25. Further, a drain port 26 is formed at an outer side area of the bottom portion of the cup body 23, and a drain pipe 26a is connected to the drain port 26.

The resist coating apparatus also includes a resist solution nozzle 30 for supplying a resist solution R onto the central portion of the front surface of the wafer W and a solvent nozzle 40 for supplying a solvent S, for example thinner to the central portion of the front surface of the wafer W. The resist solution nozzle 30 is connected to a resist solution supply source 32 for supplying the resist solution R via a resist solution supply pipe 31.

Along the resist solution supply pipe 31, a supply equipment group 33 is also provided including a valve, a flow control unit and so on. The solvent nozzle 40 is connected to a solvent supply source 42 for supplying the solvent S, for example, thinner via a solvent supply pipe 41.

Along the solvent supply pipe 41, a supply equipment group 43 is also provided including a valve, a flow control unit and so on. In this embodiment, the resist solution supply source 32 and the supply equipment group 33 correspond to a resist solution supply unit, and the solvent supply source 42 and the supply equipment group 43 correspond to a solvent supply unit.

Figure 2:
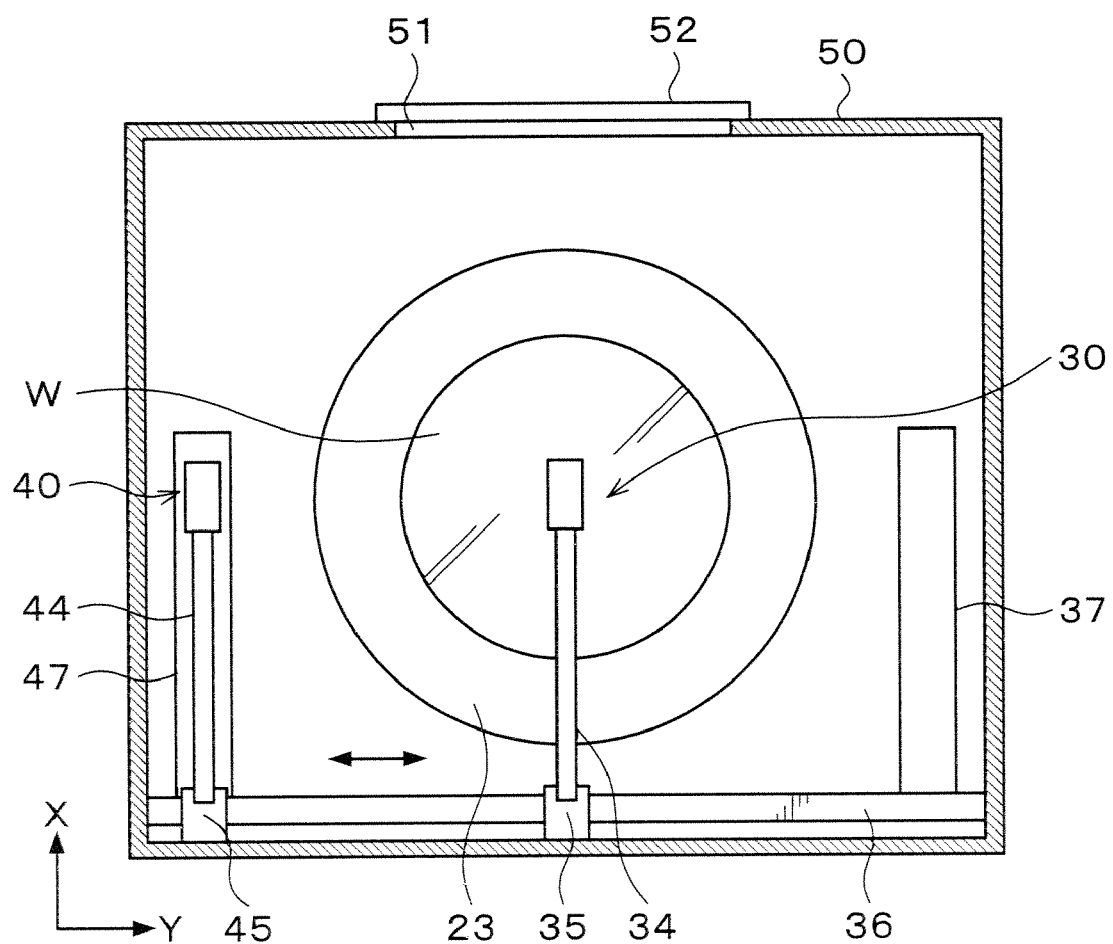
FIG. 2 is a schematic plan view showing the resist coating apparatus according to the embodiment.

The resist solution nozzle 30 is connected, as shown in FIG. 2, to a moving mechanism 35 via an arm 34 bent in an L-shape. The arm 34 is configured to be able to move along a guide rail 36 provided along the length direction (Y-direction) of a treatment container 50 by means of the moving mechanism 35 from a waiting region 37 provided outside on one end side (right side in FIG. 2) of the cup body 23 to the other end side and move in the vertical direction.

The solvent nozzle 40 is connected, as shown in FIG. 2, to a moving mechanism 45 via an arm 44 bent in an L-shape. The arm 44 can move along the guide rail 36 by means of the moving mechanism 45 from a waiting region 47 provided outside on the other end side (left side in FIG. 2) of the cup body 23 to the one end side and move in the vertical direction. A carry-in/out port 51 for the wafer W is formed in a side surface of the treatment container 50 facing a carry-in region of a carrier arm being a carrier means, and an opening/closing shutter 52 is provided at the carry-in/out port 51.

The resist coating apparatus includes, as shown in FIG. 1, a controller 6 having a computer program for controlling a later-described series of operations, and the controller 6 is configured to control the rotation drive unit 21, the supply equipment groups 33 and 43, and so on. The computer program is stored in a storage medium, for example, a flexible disk (FD), a memory card, a compact disk (CD), a magneto-optical disk (MO), a hard disk, or the like and installed in a computer being the controller 6.

Figure 3:
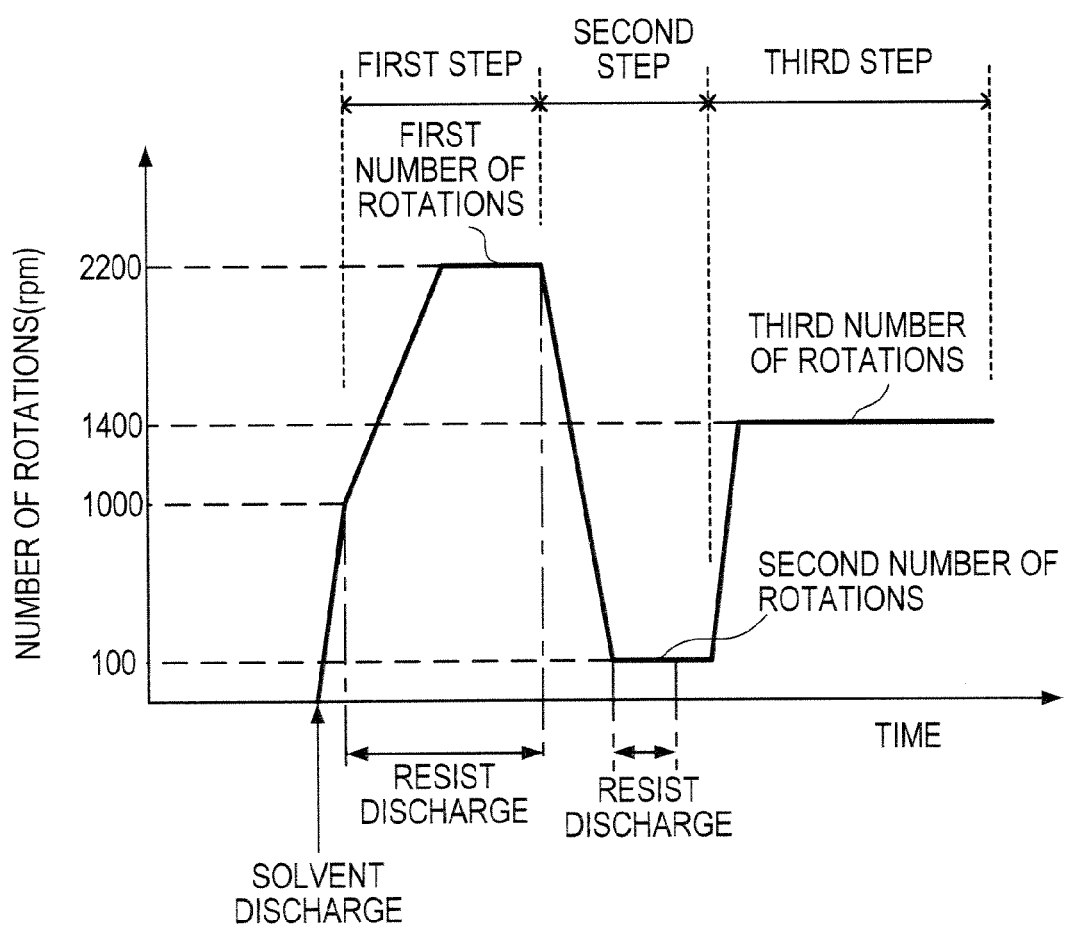
FIG. 3 is an explanatory view showing one example of the recipe in which a profile of the number of rotations of a wafer and the timing of supply of a resist solution are correlated with each other in the embodiment.

Next, the operation of the above-described embodiment will be described. FIG. 3 shows a profile (recipe) of the number of rotations of the wafer W according to the coating method of this embodiment of the present invention, and FIG. 4 schematically illustrates the states of a solution film on the front surface of the wafer at respective timings shown in FIG. 3. Note that the time lengths of respective processes in FIG. 3 do not always correspond to the actual time lengths for easy understanding of the technology.

First of all, an external carry arm holding the wafer W (for example, a carrier arm A2 or A3 in FIG. 10) outside the resist coating apparatus enters the container 50 via the carry-in/out port 51 (see FIG. 2) and transfers a 12-inch size wafer W to the spin chuck 20 therefrom. This transfer may be performed by raising the spin chuck 20 or by using not-shown raising and lowering pins. The wafer W is then held on the spin chuck 20 by suction, and the solvent nozzle 40 moves to a position above the central portion of the wafer W and supplies, for example, 2.0 ml of the solvent S, for example, thinner onto the central portion of the standing-still wafer W therefrom.

Subsequently, the solvent nozzle 40 is moved from the position above the central portion of the wafer W, and instead, the resist solution nozzle 30 is moved to a position above the central portion of the wafer W, and the wafer W is rotated by controlling the rotation drive unit 21 so that the number of rotations of the wafer W is increased to 1000 rpm at an acceleration of 10000 rpm/sec. At the point in time when the number of rotations reaches 1000 rpm, the resist solution nozzle 30 starts to discharge the resist solution R onto the central portion of the wafer W, and the number of rotations is increased to 2200 rpm that is a first number of rotations. The step in which the number of rotations of the wafer W is increased from 1000 rpm to reach the first number of rotations shall be a first step here.

The states on the front surface of the wafer W so far are shown at (i), (ii), and (iii) in FIG. 4. The time required for the number of rotations of the wafer W to reach 1000 rpm is 0.1 seconds, and the wafer is thus rotated at 1000 rpm in a moment, so that the solvent S supplied on the central portion of the wafer W is spread outward, that is, pre-wetting is performed, whereby the front surface of the wafer W becomes wet with the solvent S ((i) in FIG. 4).

Then, from the point in time when the number of rotations reaches 1000 rpm, the resist solution R is dropped onto the central portion of the wafer W, so that the resist solution R is smoothly diffused without any trouble to cause no unevenness in coating due to spreading in streaks, and the number of rotations of the wafer W is further increased, while the resist solution R continues to be dropped onto the central portion of the wafer W during the increase (during acceleration) ((ii) in FIG. 4).

The time for the number of rotations of the wafer W to increase from 1000 rpm to reach 2200 rpm and be subsequently maintained at 2200 rpm for rotation is 1.6 seconds, while the resist solution nozzle 30 discharges 0.4 ml of the resist solution R in 1.6 seconds. However, since the amount of resist solution R discharged is small in the first step, the resist solution R may not have spread over the entire front surface of the wafer W when the number of rotations of the wafer W reaches 2200 rpm ((iii) in FIG. 4).

Rotation of the wafer W at high speed of the first number of rotations will dry the resist solution R. Hence, after the number of rotations of the wafer W reaches 2200 rpm, the control shifts to a deceleration state instantaneously to decelerate the rotation to a second number of rotations at which drying hardly proceeds. It is preferable to perform the deceleration as soon as possible, in which the rotation is decelerated to the second number of rotations, for example, to 100 rpm, for example, at an acceleration (a negative acceleration) of 30000 rpm/sec. The time required to decrease the number of rotations from the first number of rotations to the second number of rotations is preferably, for example, within 0.2 seconds.

Note that the second number of rotations is not limited to 100 rpm, but is preferably 500 rpm or less. Besides, the time for the number of rotations to decrease from the first number of rotations to the second number of rotations and be subsequently maintained at the second number of rotations is, for example, 0.6 seconds, and the time may be adjusted depending on the viscosity or the like of the resist solution R. The step in which the number of rotations of the wafer W is decreased from the first number of rotations to the second number of rotations and the wafer W is rotated at the second number of rotations shall be a second step here.

When the number of rotations of the wafer W reaches the second number of rotations in the second step, the resist solution nozzle 30 discharges again 0.1 ml of the resist solution R in 0.4 seconds as shown at (iv) in FIG. 4. Discharge of the undried resist solution R improves the flowability of the resist solution R on the wafer W.

After the wafer is rotated at the second number of rotations, the number of rotations of the wafer W is increased, for example, to a third number of rotations lower than the first number of rotations and maintained at the third number of rotations for a while, for example, for 20 seconds. The step in which the number of rotations of the wafer W is increased from the second number of rotations to the third number of rotations and the wafer W is rotated at the third number of rotations shall be a third step here. In the third step, the resist solution R spreads over the entire front surface of the wafer W and the remaining resist solution R is also shaken off so that the film thickness is adjusted.

The third number of rotations and its duration are determined depending on the target film thickness, the viscosity of the resist solution R and so on, and the number of rotations for the 12-inch size wafer is preferably 2000 rpm or less and is set, for example, to 750 rpm to 2000 rpm. The wafer W is thereafter subjected to rinse treatment for its rear surface and then transferred to the external carrier arm by the operation reverse to that for the above-described carry-in.

According to this embodiment, drying of the resist solution R on the wafer W is restrained by decreasing the rotation of the wafer W down to the second number of rotations during the second step and rotating the wafer W at the second number of rotations. The discharge of the resist solution R at the same tie during the second step increases the flowability of the resist solution R.

Accordingly, when the supply amount of the resist solution R is small, the resist solution R smoothly spreads out to the edge of the wafer W during the third step even if the resist solution R does not completely spread to the edge of the wafer W in the first step. This eliminates polarization of the distribution of the resist film to be formed on the wafer W, unlike the prior art, thereby increasing the in-plane uniformity of the film thickness of the resist film. In other words, the coating treatment with a high in-plane uniformity of the film thickness can be performed even with a small amount of resist solution R.

In the second step, the resist solution R dries faster during the time when the wafer W is deceleratingly rotated from the first number of rotations to the second number of rotations than during the time when the wafer W is rotated at the second number of rotations. In this embodiment, the discharge of the resist solution R in the second step is performed after the number of rotations of the wafer W reaches the second number of rotations, thus eliminating the resist solution R from drying during the decelerating rotation. Thus, the flowability of the resist solution R can increase to spread more smoothly to the edge of the substrate in the third step.

Further, on inspection by the inventors, the supply amount of the resist solution in this embodiment can be reduced by about 20% compared to the supply amount of the resist solution required to obtain the same in-plane uniformity by using the prior method as that by this embodiment.

It should be noted that the first number of rotations is preferably 4000 rpm or less and more preferably 2000 rpm to 4000 rpm for the 12-inch size wafer W. The first number of rotations is preferably 6000 rpm or less and more preferably 3000 rpm to 5000 rpm for the 8-inch size wafer W. Further, the third number of rotations is preferably 4000 rpm or less for the 8-inch size wafer W.

In the above-embodiment, in place of the resist solution R discharged during the second step, a resist solution R may be used which is lower in viscosity than the resist solution R discharged during the first step. The resist solution R discharged during the second step is decreased in viscosity by changing the ratio of the solvent contained in the resist solution R. In this case, the resist coating apparatus is farther provided with a resist solution nozzle 60 for discharging the resist solution R during the second step as shown in FIG. 5. The resist solution nozzle 60 is connected to a resist solution supply source 62 for supplying the resist solution R via a resist solution supply pipe 61. Along the resist solution supply pipe 61, a supply equipment group 63 is also provided including a valve, a flow control unit and so on. The supply equipment group 63 is connected to the controller 6 that controls the flow rate, the discharge timing, and so on of the resist solution R discharged from the resist solution nozzle 60.

Figure 6:
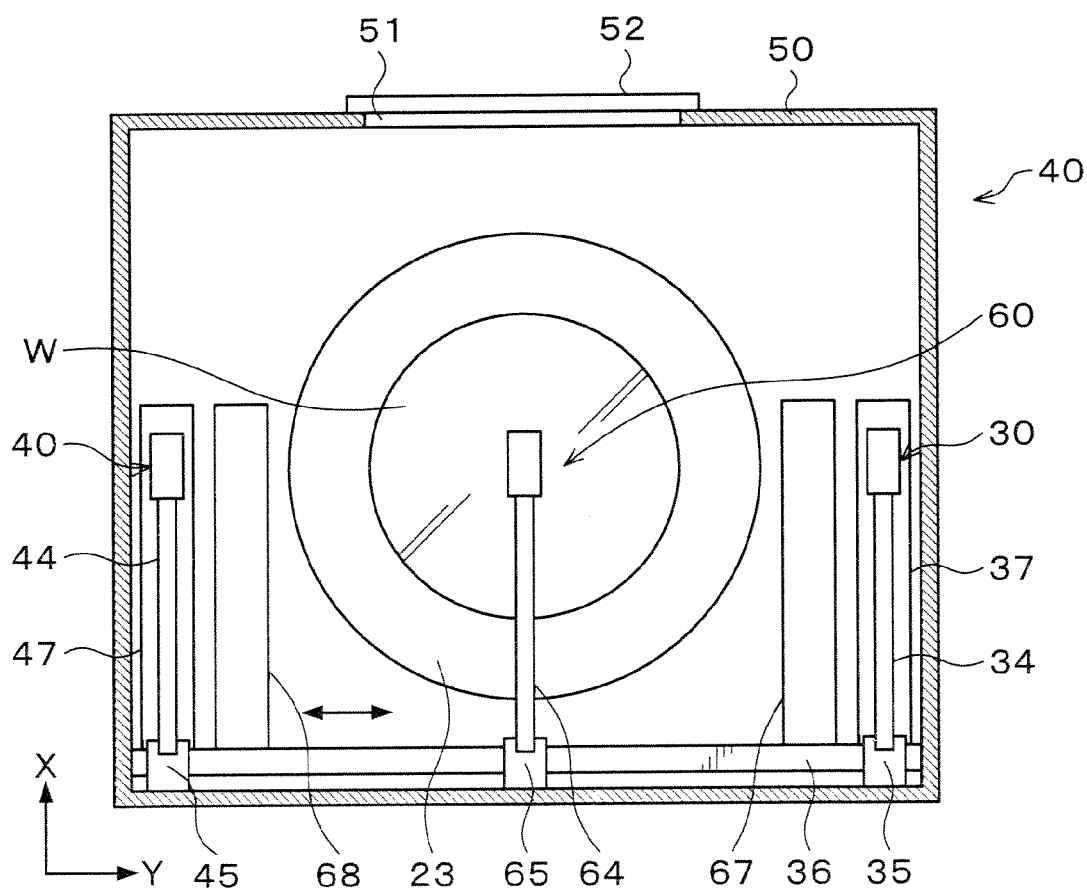
FIG. 6 is a schematic plan view showing the resist coating apparatus according to the other embodiment.

The resist solution nozzle 60 is connected, as shown in FIG. 6, to a moving mechanism 65 via an arm 64 bent in an L-shape. The arm 64 is configured to be able to move in a horizontal direction (Y-direction) along the guide rail 36 by means of the moving mechanism 65 from a waiting region 67 or 68 provided outside the cup body 23 and move in the vertical direction. The waiting region 67 is provided between the outside of the cup body 23 (right side in FIG. 6) and the waiting region 37, and the waiting region 68 is provided between the outside of the cup body 23 (left side in FIG. 6) and the waiting region 47.

Next, a method of discharging the resist solution R from the resist solution nozzle 60 will be described. While the resist solution nozzle 30 is discharging the resist solution R in the first step, the resist solution nozzle 60 is waiting in the waiting region 68. After completion of the discharge of the resist solution R from the resist solution nozzle 30, the resist solution nozzle 30 moves to the waiting region 37. Upon start of the second step, the resist solution nozzle 60 moves to a position above the central portion of the wafer W, and discharges the resist solution R when the number of rations of the wafer W reaches the second number of rotations. After completion of the discharge of the resist solution R from the resist solution nozzle 60, the resist solution nozzle 60 moves to the waiting region 67 and waits at the waiting region 67 during the third step.

As described above, the resist solution R discharged in the second step is low in viscosity than the resist solution R discharged in the first step, so that the resist solution increases in flowability in the third step to smoothly spread to the edge of the wafer W during the third step. Accordingly, the in-plane uniformity of the film thickness of the resist film increases.

In the above embodiment, in place of the resist solution R discharged during the second step, the solvent S may be used. In this case, in the second step, the solvent S is discharged from the solvent nozzle 40. The solvent S is much lower in viscosity than the resist solution R supplied in the first step. Accordingly, the flowability of the resist solution R further increases in the third step, so that the in-plane uniformity of the film thickness of the resist film further increases.

The resist solution R or the solvent S discharged in the second step may be discharged to a position displaced from the central portion of the wafer W. More specifically, in the second step, the resist solution nozzle 30, the resist solution nozzle 60, or the solvent nozzle 40 moves to a position displaced from the position above the center portion of the wafer W and discharges the resist solution R or the solvent S. In this case, the resist solution R or the solvent S is discharged to a position closer to the edge of the wafer W, thus allowing the resist solution R to smoothly spread to the edge of the substrate in the third step.

Figure 7:
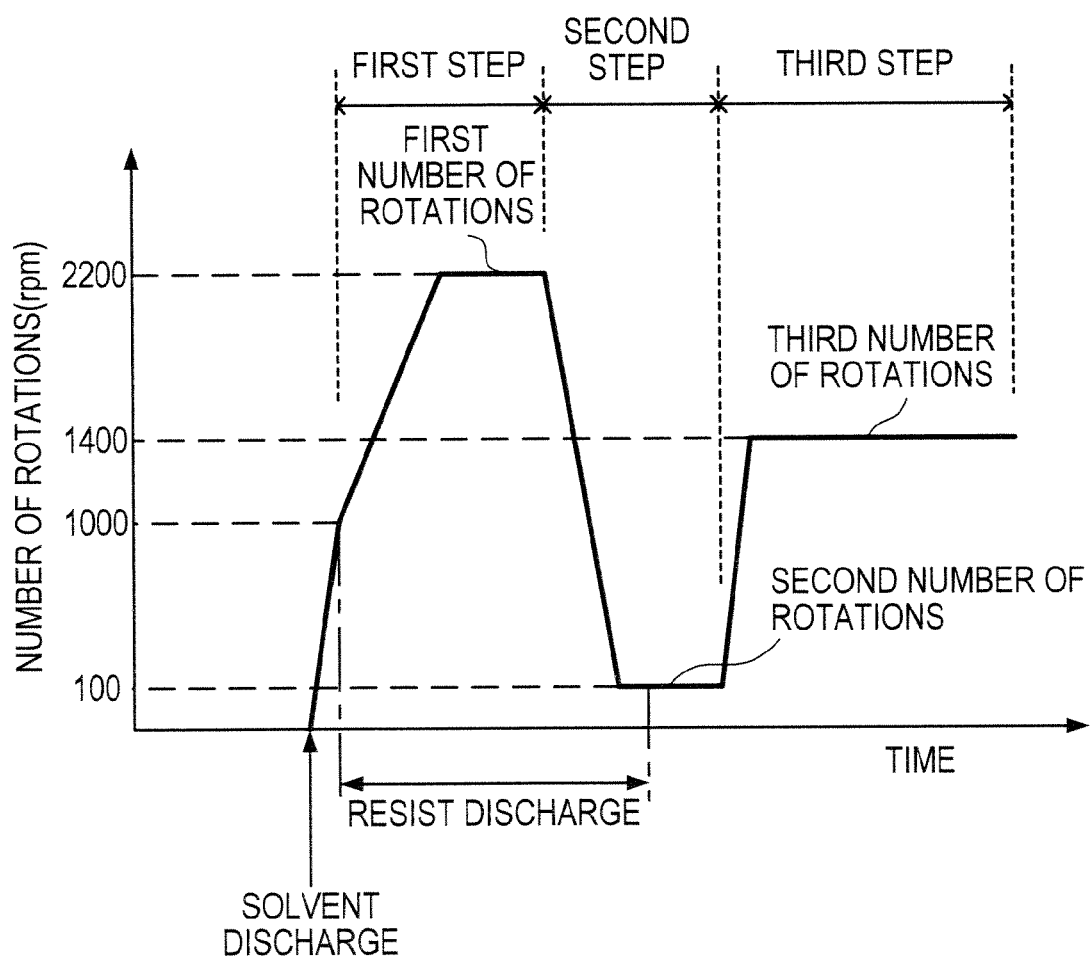
FIG. 7 is an explanatory view showing one example of the recipe in which a profile of the number of rotations of the wafer and the timing of supply of the resist solution are correlated with each other in the other embodiment.

Further, the discharged of the resist solution R in the second step may be performed continuously from the discharge of the resist solution R in the first step. In other words, as shown in FIG. 7, the resist solution R discharged from the resist solution nozzle 30 in the first step is continuously discharged while the number of rotations of the wafer W is decreased from the first number of rotations to the second number of rotations and maintained at the second number of rotations. More specifically, when the number of rotations of the wafer W starts to be decreased from the first number of rotations, an amount of resist solution R of 0.1 ml is discharged in 0.4 seconds in the second step. The in-plane uniformity of the film thickness of the resist film can be made higher also in this case than in the case when the resist solution is applied by the conventional method as clear from a later-described example 1.

As for the discharged of the resist solution R in the first step, the discharge may be started during accelerating rotation of the wafer W to the first number of rotations and stopped by the time when the number of rotations reaches the first number of rotations, or the discharged may be started during the rotation at the first number of rotations.

Figure 8:
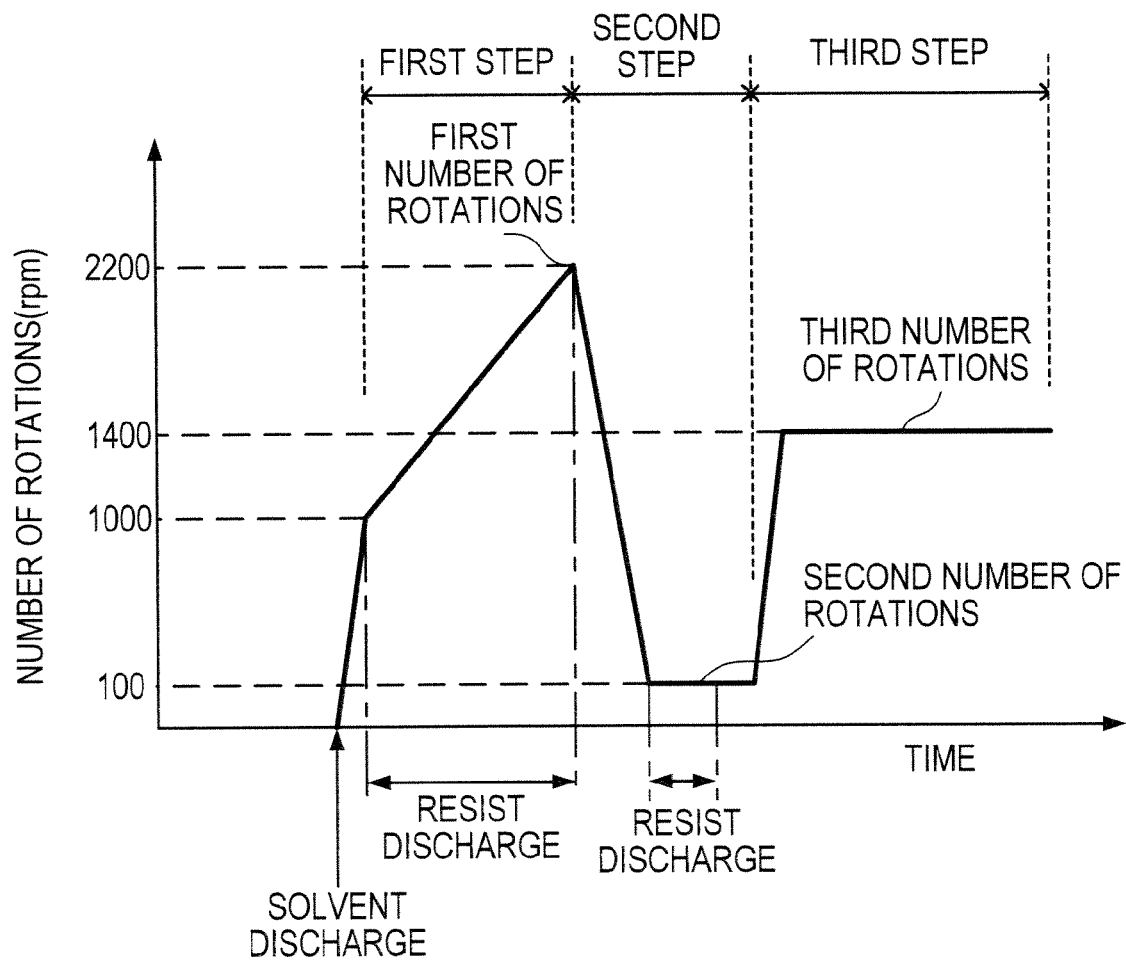
FIG. 8 is an explanatory view showing one example of the recipe in which a profile of the number of rotations of the wafer and the timing of supply of the resist solution are correlated with each other in the other embodiment.

Further, the number of rotations of the wafer W is not limited to that after the number of rotations of the wafer W reaches the first number of rotations, the first number of rotations is maintained for a while, but may be decreased to the second number of rotations immediately after reaching the first number of rotations as shown in FIG. 8.

Figure 9:
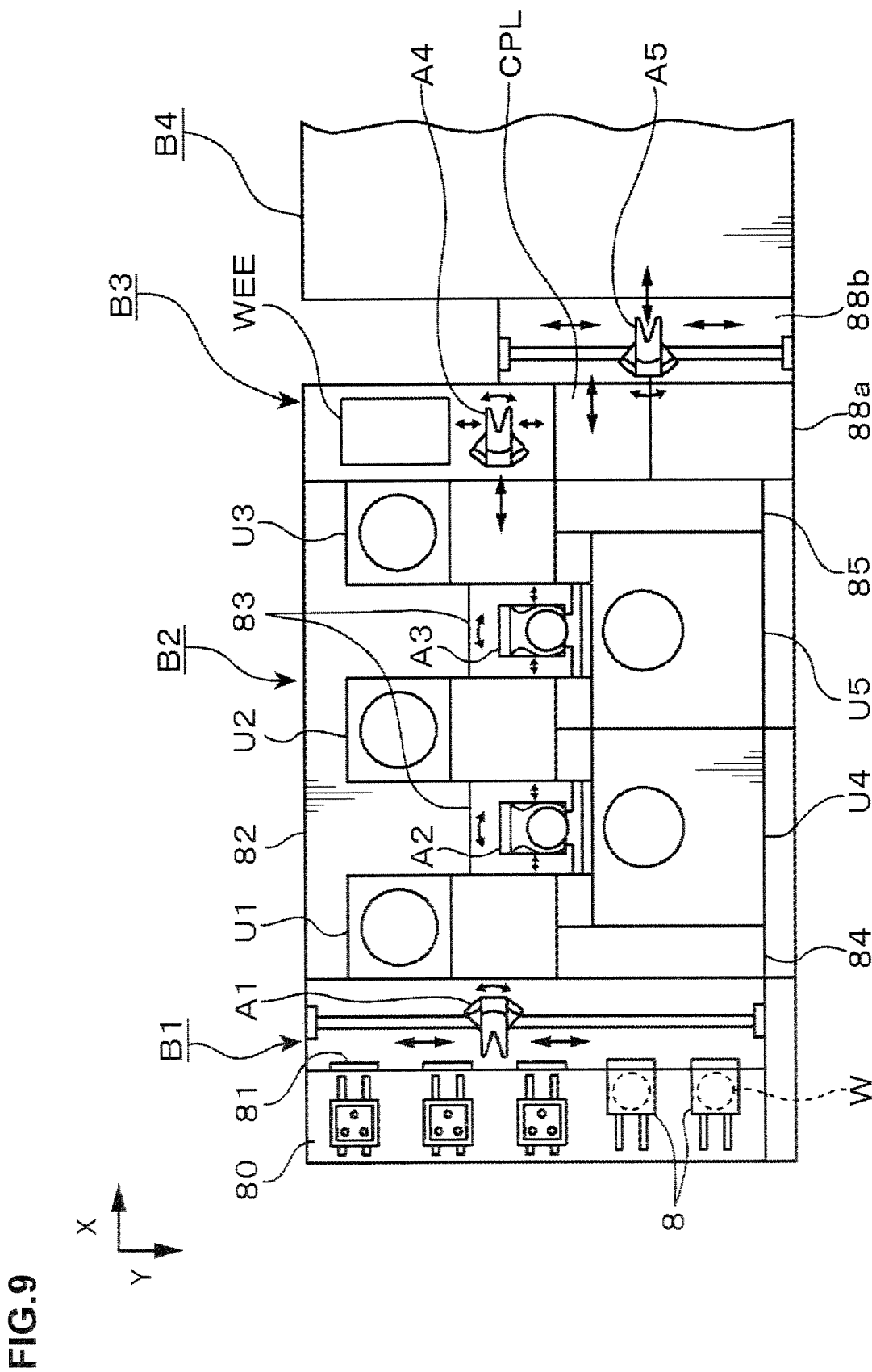
FIG. 9 is a plan view showing a coating and developing system in which the resist coating apparatus of the embodiment is incorporated.
Figure 10:
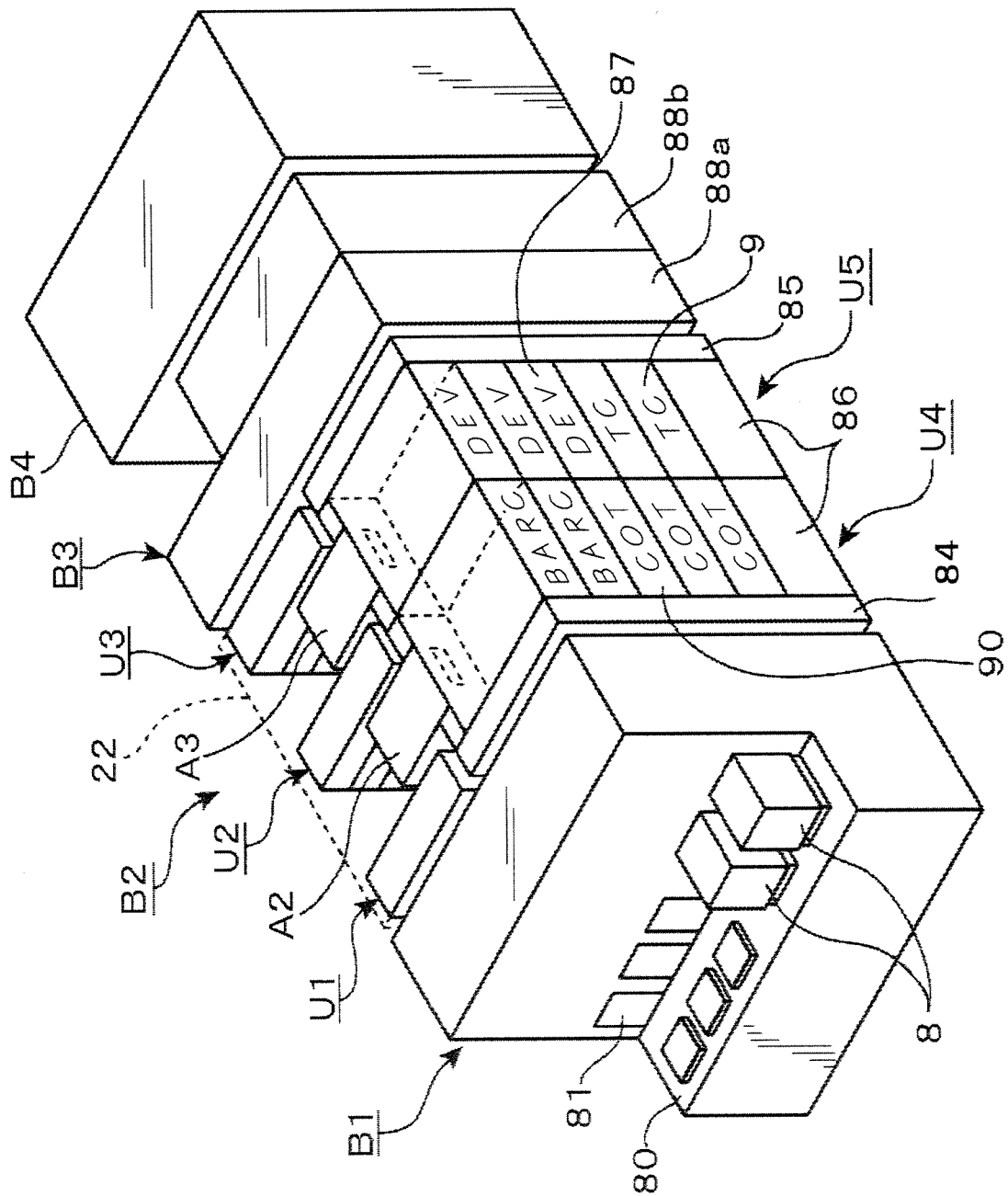
FIG. 10 is a schematic configuration view showing the coating and developing system in which the resist coating apparatus of the embodiment is incorporated.

Next, just for reference, the whole configuration of a coating and developing system in which the above-described resist coating apparatus is incorporated and to which an aligner is connected will be described with reference to FIG. 9 and FIG. 10. In FIG. 9 and FIG. 10, symbol B1 denotes a carrier station for carry-in/out a carrier 8 hermetically housing a plurality of wafers W, for example, 13 wafers W, and a mounting section 80 capable of mounting a plurality of carriers 8 arranged side by side thereon, opening/closing units 81 provided in the wall surface on the front side as viewed from the mounting section 80, and a transfer means A1 for taking the wafers W out of the carriers 8 via the opening/closing units 81, are provided in the carrier station B1.

To the rear side of the carrier station B1, a processing block B2 is connected which is surrounded by a housing 82, and shelf units U1, U2 and U3 in each of which units of heating and cooling systems are multi-tiered and main arms A2 and A3 forming substrate carrier means for transferring the wafer W between the units in shelf units U1, U2 and U3 and solution treatment units U4 and U5 are provided arranged alternately in sequence from the front side in the processing block B2. Further, each of the main arms A2 and A3 is placed in a space surrounded by a partition wall 83 composed of face portions on the side of the shelf units U1, U2, and U3 which are arranged in a forward and backward direction as viewed from the carrier station B1, one face portion on the side of, for example, the later-described solution treatment unit U4 or U5 on the right side, a rear face portion forming one face on the left side. Numerals 84 and 85 in FIG. 9 and FIG. 10 denote temperature and humidity regulating units each comprising a temperature regulator, a duct for regulating the temperature and humidity and so on for treatment solutions used in the units.

The solution treatment units U4 and U5 are configured such that the above-described resist coating apparatuses (COT) 90 for applying the resist solution to the front surface of the wafer W, developing units (DEV) 87 for applying a developing solution to front surface of the wafer W, antireflection film forming units (BARC) and so on are multi-tiered, for example, five-tiered on chemical storage unit 86 for the resist solution R, the developing solution and so on, for example, as shown in FIG. 10. Besides, the already-described shelf units U1, U2, and U3 are configured such that various kinds of units for performing pre-processing and post-processing of the treatments performed in the solution treatment units U4 and U5 are multi-tiered, for example, ten-tiered, in which the combination of the units includes a heating unit for heating (baking) the wafer W, a cooling unit for cooling the wafer W, and so on.

To the rear side of the shelf unit U3 in the processing block B2, an aligner B4 is connected via an interface section B3 composed of a first carrier chamber 88*a* and a second carrier chamber 88*b*. Inside the interface section B3, an edge exposure unit (WEE) for selectively exposing only an edge portion of the wafer W, a buffer cassette (SBU) for temporarily housing a plurality of, for example, 25 wafers W, a transfer unit (TRS 2) for transferring the wafer W, a high-precision temperature regulating unit (CPL), for example, having a cooling plate and so on are provided in addition to two transfer means A4 and A5 for transferring the wafer W between the processing block B2 and the aligner B4.

Taking an example of the flow of the wafer W in this system, when the carrier 8 housing wafers W is carried in from the outside and mounted on the mounting table 80, the lid body of the carrier 8 is removed together with the opening/closing unit 81, and a wafer W is taken out by the transfer means A1. The wafer W is transferred via a transfer unit (not shown) forming one tier in the shelf unit U1 to the main carrier means A2 and subjected, for example, to hydrophobic treatment and cooling processing as the pre-processing of the coating treatment in one shelf in one of the shelf units U1 to U3. Thereafter, the resist solution is applied to the front surface of the wafer W in the resist coating apparatus (COT) 90, and a water-repellent protection film is then formed on the front surface of the wafer W having the resist film formed thereon in a protection film forming unit (TC) 3 being a protection film forming section.

Subsequently, the wafer W is heated (baking processing) in the heating unit (PAB) forming one tier in one of the shelf units U1 to U3, then cooled, and carried via the transfer unit (TRS 1) in the shelf unit U3 into the interface section B3. In the interface section B3, the wafer W is carried by the transfer means A4, for example, from the edge exposure unit (WEE), to the buffer cassette (SBU), and then to the high-precision temperature regulating unit (CPL), and the wafer W mounted on the high-precision temperature regulating unit (CPL) is carried by the transfer means A5 to the aligner B4 where the wafer W is subjected to exposure processing. The exposed wafer W is carried by the transfer means A5 to the transfer unit (TRS 2) and then carried by the transfer means A5 from the transfer unit (TRS 2) to the heating unit (PEB) in the shelf unit U3.

In the developing unit (DEV) forming one tier in the shelf unit U5, the developing solution is supplied to the front surface of the wafer W to develop the resist, whereby a resist mask in a predetermined pattern is formed on the wafer W. Thereafter, the wafer W is returned by the transfer means A1 to the original carrier 8 on the mounting table 80.

A preferred embodiment of the present invention has been described above with reference to the accompanying drawings, but the present invention is not limited to the embodiment. It should be understood that various changes and modifications within the scope of the spirit as set forth in claims are readily apparent to those skilled in the art, and those should also be covered by the technical scope of the present invention.

Example

Hereinafter, the effect of the coating treatment method of the present invention will be described comparing to that of the conventional coating treatment method. As the apparatus for performing both methods, the resist coating apparatus shown in FIG. 1 and FIG. 2 was used.

The recipe shown in FIG. 7 illustrated above was used as the recipe for coating the resist solution R in the experiment by the coating treatment method of the present invention.

Figure 11:
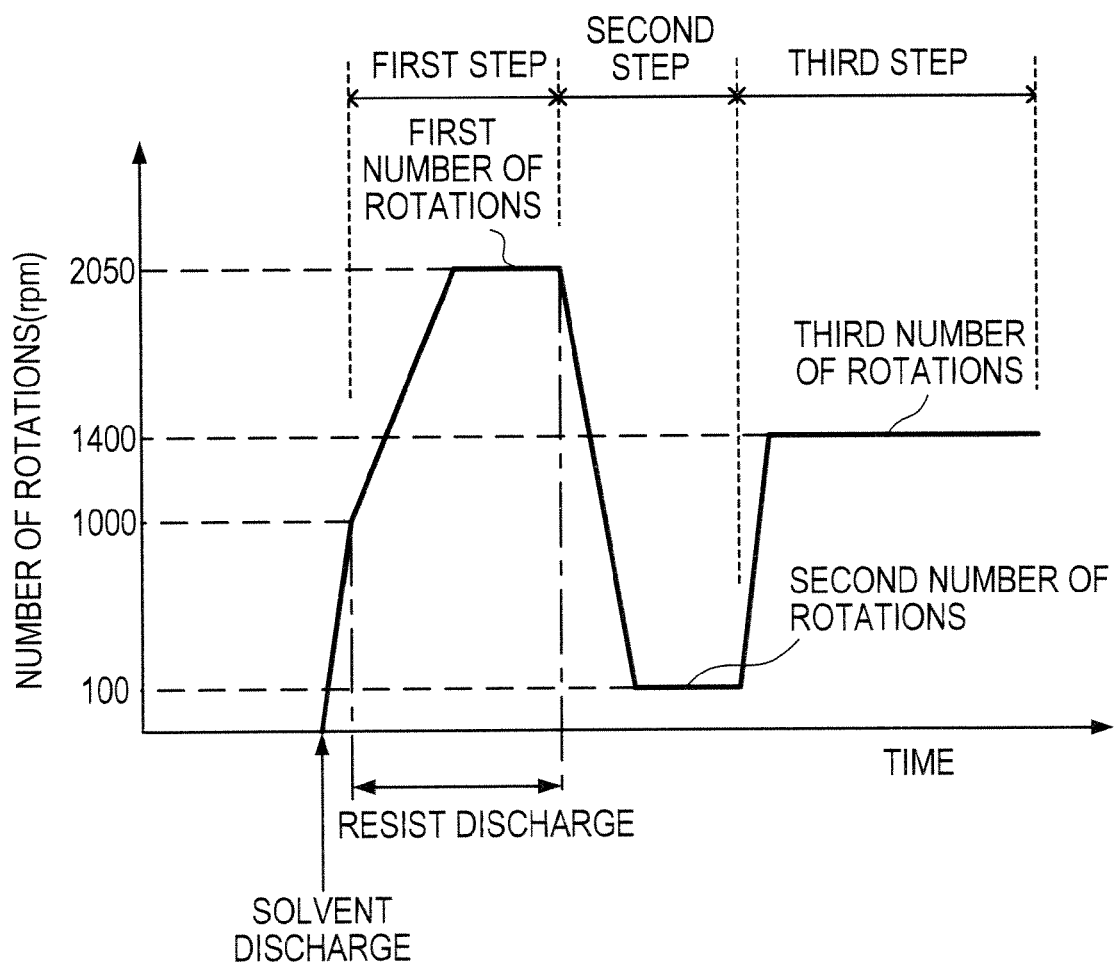
FIG. 11 is an explanatory view showing one example of the recipe in which a profile of the number of rotations of the wafer and the timing of supply of the resist solution are correlated with each other in a conventional embodiment.
Figure 12:
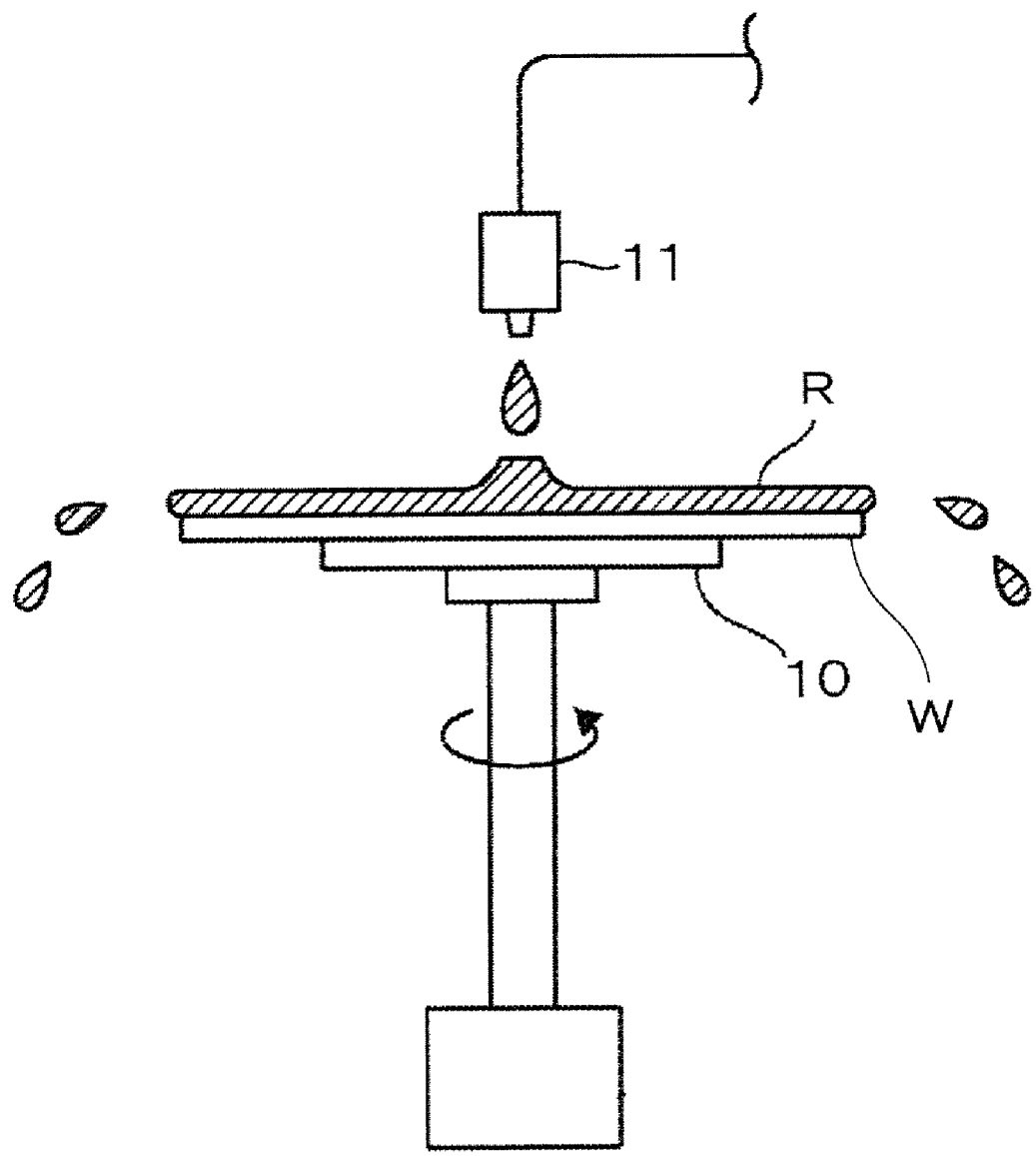
FIG. 12 is an explanatory view showing an appearance of the dropped resist solution spreading on the front surface of the wafer in the conventional example.

The recipe shown in FIG. 11 was used as the recipe for coating the resist solution R in the experiment performed by the conventional coating treatment method. In the recipe shown in FIG. 11, the first number of rotations is 2050 rpm. The time for the number of rotations of the wafer W to increase from 1000 rpm to reach 2050 rpm and be subsequently maintained at 2050 rpm for rotation is 1.5 seconds, while 0.5 ml of the resist solution is discharged in 1.5 seconds.

Subsequently, the rotation is decelerated from the first number of rotations to 100 rpm that is the second number of rotations and maintained at the second number of rotations, the time required for which is 1 second, during which the resist solution is never discharged. The remaining recipe is the same as that of the recipe shown in FIG. 7.

Note that in performing both experiments, the supply amounts of the resist solution R to the wafer W in both cases are 0.5 ml to form a resist film with a film thickness of 250 nm on the wafer W. Both experiments were performed using the above recipes on 13 wafers W, respectively.

The experiments were performed as describe above, and the distributions of the film thickness of the resist films formed on the wafers W were expressed by the three sigma method to evaluate the variations in the distributions. In the case of experiment performed using the conventional method, the distribution of the film thickness of the resist film indicated a three sigma (3σ) of 1.8 nm to 2.0 nm.

On the other hand, in the case of experiment performed using the coating treatment method of the present invention, the distribution of the film thickness of the resist film indicated a three sigma (3σ) of 0.6 nm to 0.7 nm. In other words, it was found that the variation in the distribution of the film thickness is smaller in the coating treatment method of the present invention than in the conventional method. Accordingly, it was found that the resist solution R can be applied to the wafer W with higher in-plane uniformity in the coating treatment method of the present invention than in the conventional method.

The present invention is in useful when applying a coating solution such as the resist solution or the like to a substrate such as a semiconductor wafer or the like.

What is claimed is:

1. A method of supplying a solvent for a resist solution to a substrate to wet a front surface of the substrate with the solvent and then coating the substrate with the resist solution, said method comprising:
   a first step of acceleratingly rotating the substrate to a first number of rotations after supplying the solvent thereto, and supplying the resist solution to a central portion of the substrate during at least the accelerating rotation or the rotation at the first number of rotations;
   a second step of thereafter deceleratingly rotating the substrate to a second number of rotations, and supplying the resist solution to the substrate during at least the decelerating rotation or the rotation at the second number of rotations; and
   a third step of thereafter acceleratingly rotating the substrate to a third number of rotations higher than the second number of rotations, and rotating the substrate at the third number of rotations,
   wherein the resist solution supplied in said second step is a resist solution lower in viscosity than the resist solution supplied in said first step.

2. The coating treatment method as set forth in claim 1, wherein the supply of the resist solution in said second step is performed after the number of rotations of the substrate reaches the second number of rotations.

3. The coating treatment method as set forth in claim 1, wherein the resist solution supplied in said second step is supplied from a nozzle different from a nozzle for supplying the resist solution used in said first step.

4. The coating treatment method as set forth in claim 1, wherein the resist solution supplied in said second step is supplied to a position displaced from the central portion of the substrate.

5. The coating treatment method as set forth in claim 1, wherein the supply of the resist solution in said second step is performed continuously from the supply of the resist solution in said first step.

* * * * *